(12) United States Patent
Maleville et al.

(10) Patent No.: US 7,544,058 B2
(45) Date of Patent: Jun. 9, 2009

(54) METHOD FOR HIGH-TEMPERATURE ANNEALING A MULTILAYER WAFER

(75) Inventors: Christophe Maleville, La Terrasse (FR); Walter Schwarzenbach, Saint Nazaire les Eymes (FR); Vivien Renauld, Pontcharra (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 11/777,728

(22) Filed: Jul. 13, 2007

(65) Prior Publication Data

US 2007/0298363 A1    Dec. 27, 2007

Related U.S. Application Data

(63) Continuation of application No. PCT/IB2005/000483, filed on Feb. 3, 2005.

(51) Int. Cl.
*F27B 9/12* (2006.01)
(52) U.S. Cl. .................. 432/18; 432/5; 432/12
(58) Field of Classification Search ............ 432/4, 432/5, 12, 18; 438/770
See application file for complete search history.

(56) References Cited

U.S. PATENT DOCUMENTS

| | | | |
|---|---|---|---|
| 5,244,843 A | 9/1993 | Chau et al. | 437/239 |
| 5,631,199 A * | 5/1997 | Park | 438/770 |
| 5,851,892 A * | 12/1998 | Lojek et al. | 438/770 |
| 6,395,610 B1 * | 5/2002 | Roy et al. | 438/354 |
| 6,551,946 B1 * | 4/2003 | Chen et al. | 438/770 |
| 6,962,728 B2 * | 11/2005 | Lung et al. | 427/255.29 |
| 7,151,059 B2 * | 12/2006 | Chaudhry et al. | 438/770 |
| 2004/0228969 A1 | 11/2004 | Lung et al. | 427/255.37 |
| 2005/0186806 A1 * | 8/2005 | Shin | 438/770 |
| 2007/0020886 A1 * | 1/2007 | Brunier et al. | 438/458 |
| 2007/0026692 A1 * | 2/2007 | Maleville et al. | 438/795 |

FOREIGN PATENT DOCUMENTS

| | | |
|---|---|---|
| GB | 2 302 870 | 2/1997 |
| GB | 2 355 582 | 4/2001 |
| GB | 2 367 427 | 4/2002 |
| JP | 11 016902 | 1/1999 |

OTHER PUBLICATIONS

J.P. Colinge, "Silicon On Insulator Technologies Materials to VLSI", pp. 50-51, Sep. 30, 1997.

* cited by examiner

*Primary Examiner*—Gregory A Wilson
(74) *Attorney, Agent, or Firm*—Winston & Strawn LLP

(57) ABSTRACT

A method for annealing a multilayer wafer by subjecting the wafer to a high temperature treatment that includes at least a temperature ramp-up between a boat-in temperature and a process of at least 800° C.; at least a processing phase in the range conduct at or above the process temperature; and a temperature ramp-down from the processing phase to a boat-out temperature. The boat-in temperature is sufficiently lower than the boat-out temperature to reduce or avoid tearing-off defects on the wafer and to reduce particle contaminants on the wafer, as well as to reduce or avoid degrading wafer Dit compared to an annealing method where the boat-in and boat-out temperatures are closer in temperature.

13 Claims, 2 Drawing Sheets

METHOD FOR HIGH-TEMPERATURE ANNEALING A MULTILAYER WAFER

CROSS-REFERENCE TO RELATED APPLICATIONS

This application is a continuation of International application no. PCT/IB2005/000483 filed Feb. 3, 2005, the entire content of which is expressly incorporated herein by reference thereto.

BACKGROUND OF THE INVENTION

The invention generally concerns the high-temperature treatments carried out on multilayer semiconductor wafers such as e.g. silicon-on-insulator (SOI) wafers.

The invention can thus be used for treating SOI wafers, but it also applies to any kind of multilayer wafer made with materials selected from the semiconductor materials ("semiconductor wafers").

In this text the "high temperatures" (HT) refer to temperatures of at least 800° C., while the term "transfer method" refers to a method for manufacturing multilayer semiconductor wafers, and implying a transfer step during which:
- a top (or "donor") wafer is bonded on a base wafer (also called "handle", or "receiver" wafer),
- at least part of the top wafer remains with the base wafer after the bonding.

A transfer method can be carried out e.g. according to the following methods:
- the Smart-Cut® method (it is specified that a general description of this method can be found e.g. in Jean-Pierre Colinge—"Silicon On Insulator Technologies, Materials to VLSI", Kluwer Academic Publisher, $2^{nd}$ edition),
- the ELTRAN™ method, or
- other layer transfer methods.

The "active layer" of a multilayer semiconductor wafer is the layer in which components shall be created—this layer being generally electrically isolated from the rest of the wafer. The active layer is generally a surface layer of the wafer. The Dit is the parameter which characterizes the trap interface density—which is defined as the density of electrical traps located at an interface between two layers of a multilayer structure. It is specified that in this text Dit and "trap interface density" are understood as equivalent.

This density is generally expressed in count of traps per $(eV.cm^2)$—i.e. in $\#/eV.cm^2$—and typical values for the interface BOX/active layer in a SOI are $10^{12}$ $\#/eV.cm^2$. Dit can be measured using e.g. pseudo MOSFET measurement techniques.

In the case of a multilayer wafer having an active layer on top of a buried insulating layer, "the Dit" of the wafer shall in this text refer to the Dit at the interface between the buried insulating and the active layer of the wafer. For e.g., a SOI-type wafer, the Dit of the wafer thus refers to the Dit at the interface between the surface active layer and the buried oxide insulating layer (BOX).

It is specified that in this text we shall refer to "SOI-type wafers" as multilayer wafers comprising:
- a support layer (e.g. bulk Si for a classical SOI),
- an active layer located in the surface region of the wafer (e.g. a thin film of Si—but possibly other types of films such as SiGe, Ge, or others), and
- a buried insulating layer between these two layers (e.g. a buried oxide layer).

Dit is an important parameter since it has an influence on the mobility of electrical carriers in the layers of the multilayer wafer. As an example, Dit at a BOX/active layer interface of a SOI has an influence on the carrier mobility of the active layer—the carrier mobility being in turn a parameter which influences the electrical performance of the wafer.

It is thus desired to control the value of the Dit of a multilayer wafer (i.e. at the interface BOX/active layer for a SOI wafer), in order to influence the electrical performance of the wafer (and the performance of the devices that will be formed on the wafer).

More precisely, in the perspective of increasing the mobility of electrical carriers in the active layer of a multilayer semiconductor wafer, it can be desired to minimize the value of the Dit of the wafer (it has been shown that a lower Dit of the wafer is associated with a higher mobility). In the case of a typical SOI wafer comprising an active layer (e.g. in Si) covering an insulating layer (e.g. an oxide layer), this would mean that it is desired to reduce the Dit at the interface between the active layer and the oxide layer.

High temperature annealing steps used for fabricating SOI-type wafers (e.g. SOI wafers) may require the use of "low slip lines" SiC boats with large surface of contact between the wafer and the boat, in order to minimize slip line generation. However, it has been observed that the use of such boats is associated with another drawback under the form of defects associated to a tearing-off ("tearing-off defects") on at least one layer of wafers which have undergone a HT treatment in such a boat.

To avoid the generation of such tearing-off defects, it is possible to reduce the value of the boat-in temperature (i.e. the temperature at which the wafers are introduced in the annealing chamber). Reducing the boat-in temperature indeed allows to reduce the thermal induced mechanical stress during the transition between ambient temperature and idle temperature of the annealing chamber. And a reduced boat-in temperature furthermore allows a reduction of particle contaminants on the wafers treated in an annealing chamber.

It is specified that in a context of industrial exploitation, the boat-in temperature of a thermal treatment is substantially equal to its boat-out temperature (temperature at which the wafers are put out of the annealing chamber). This equality between boat-in and boat-out temperatures is indeed a basic and natural disposition which allows to limit the time between the annealing of two successive batches of wafers, and thereby limit time where the annealing chamber is not used effectively.

Tests have been conducted for HT treatments on SOI-type wafers, with a reduced boat-in (and thus boat-out) temperatures. These tests were conducted so as to adapt a typical HT treatment of a SOI obtained by a transfer method such as e.g. the SMART-CUT® method.

Such typical HT treatment is usually carried out with the following steps:
- A first phase includes a transient phase of temperature stabilization at (or around) boat-in temperature, after the introduction in the chamber of a "cold" element at a boat-in temperature of about 600° C., and a first ramp up,
- A second phase corresponds to a thermal oxidation carried out between 800° C. and 1000° C. (e.g. around 950° C.). This phase is carried out under an atmosphere containing oxygen,
- A third phase called stabilization phase, is carried out between 900° C. and 1200° C. (e.g. around 1100° C.). This phase aims in particular at stabilizing a bonding interface between two layers of the wafer.

A final step includes a temperature ramp-down and boat out, at the same temperature as boat in.

For the tests conducted, the boat in and boat-out temperatures were lowered to 450° C., instead of 600° C. The rest of the "typical" HT thermal treatment described above was unchanged. It was unexpectedly discovered that lowering the values of boat-in/boat-out temperatures from 600° C. to 450° C. avoided generating tearing-off defects. However, such reduction was associated with another drawback.

It has also been observed that the value of the Dit of the wafers which had undergone the test mentioned above was significantly increased. This increase of Dit is illustrated in FIG. 1, which shows the values of Dit for two respective sets of batches of SOI wafers which have been respectively annealed according to:
- a "typical" HT treatment such as mentioned above (boat-in/boat-out at 600° C.)—this corresponds to the left-hand part of FIG. 1, illustrating the Dit observed for a first set of batches ("set 1"),
- the tests mentioned above (boat-in/boat-out at 450° C.)—this corresponds to the right-hand part of FIG. 1, illustrating the Dit observed for a second set of batches ("set 2").

Thus, the increased Dit observed when lowering the boat-in/boat-out temperatures of the HT treatment mentioned above corresponds to a drawback.

A goal of the invention is to eliminate—or at least diminish as much as possible this drawback in order to provide enhanced properties to the wafer by the annealing process.

SUMMARY OF THE INVENTION

In order to reach this goal, the invention proposes a method for annealing a multilayer wafer under high temperatures. This method comprises subjecting the wafer to a high temperature treatment that includes at least a temperature ramp-up between a boat-in temperature and a process of at least 800° C.; at least a processing phase in the range conduct at or above the process temperature; and a temperature ramp-down from the processing phase to a boat-out temperature. The boat-in temperature is sufficiently lower than the boat-out temperature to reduce or avoid tearing-off defects on the wafer and to reduce particle contaminants on the wafer, as well as to reduce or avoid degrading wafer Dit compared to an annealing method where the boat-in and boat-out temperatures are closer in temperature.

The high temperature treatment typically comprises an oxidation phase carried out at a temperature between 800° C. and 1000° C. It also may include a stabilization phase that follows the oxidation phase, with stabilization phase carried out at a temperature between 900° C. and 1200° C.

A preferred boat-in temperature is between 400° C. and 500° C., while a preferred boat-out temperature is between 550° C. and 750° C., with the boat-in temperature being between 50 and 350 degrees lower than the boat-out temperature.

BRIEF DESCRIPTION OF THE DRAWINGS

Other aspects, goals and advantages of the invention shall be apparent in the following description, made in reference to the drawing on which.

DETAILED DESCRIPTION OF THE PREFERRED EMBODIMENTS

The present method for conducting a high temperature treatment includes the following phases:
- At least a temperature ramp-up between a boat-in temperature and a process temperature in the range of high temperatures,
- At least a processing phase in the range of high temperatures,
- A temperature ramp-down from the processing phase to a boat-out temperature,
- the boat-in temperature has a "lowered" value which is significantly lower than the boat-out temperature,
- so that the lowered value of boat-in temperature allows avoiding tearing-off defects on the wafers and reducing the amount of particle contaminants on the wafer,
- while the boat-out temperature is kept at a value significantly greater than the lowered value of boat-in temperature, in order to avoid degrading the Dit of the wafer.

Preferred but non-limiting aspects of such a method are the following:
- the high temperature treatment comprises an oxidation phase,
- the oxidation phase is carried out at a temperature between 800° C. and 1000° C.,
- the oxidation phase is carried out at a temperature of 950° C.,
- the oxidation phase is followed by a stabilization phase,
- the stabilization phase is carried out at a temperature between 900° C. and 1200° C.,
- the stabilization phase is carried out at a temperature of 1100° C.,
- the lowered value of boat-in temperature is between 400° C. and 500° C.,
- the lowered value of boat-in temperature is 450° C.,
- the value of boat-out temperature is between 550° C. and 750° C.,
- the lowered value of boat-in temperature is 600° C.

Figure 2:
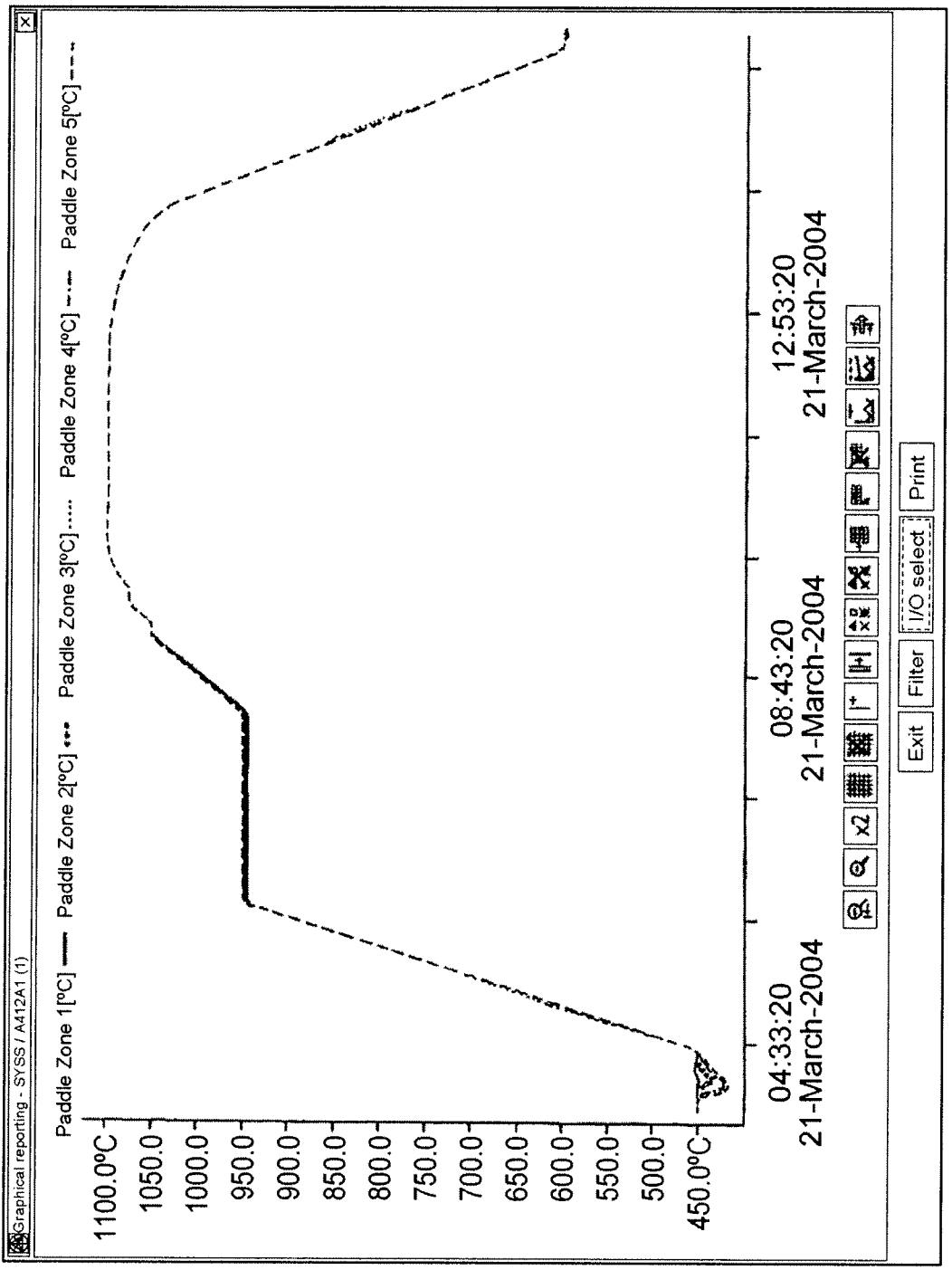
FIG. 2 is a graph illustrating the temperature evolution during a HT treatment carried out according to an embodiment of the invention.

With reference to FIG. 2, a temperature evolution during a HT treatment carried out according to an embodiment of the invention is illustrated.

This HT treatment is carried out on a multilayer wafer.

In a preferred—but non-limiting—embodiment, the wafer is a SOI-type wafer.

The wafer can have been obtained by a transfer method—e.g. a SMART-CUT® method.

The particular embodiment illustrated in FIG. 2 shows a temperature evolution as follows:
- A first phase includes a transient phase of temperature stabilization at (or around) boat-in temperature, after the introduction in the chamber of a "cold" element at a boat-in temperature, and a first ramp up,
- A second phase corresponds to a thermal oxidation carried out between 800° C. and 1000° C. (e.g. around 950° C.). This phase is carried out under an atmosphere containing oxygen, A third phase, called stabilization phase, is carried out between 900° C. and 1200° C. (e.g. around 1100° C.). This phase aims in particular at stabilizing a bonding interface between two layers of the wafer, A final step includes a temperature ramp-down and boat out.

The particular HT treatment illustrated in FIG. 2 thus comprises an oxidation phase, and a stabilization phase for stabilizing the bonding interface of a wafer obtained by a transfer method.

However, such particular phases are not a limitation of the invention, and the invention concerns all types of HT treatments comprising:

At least a temperature ramp-up between a boat-in temperature and a process temperature in the range of high temperatures, At least a processing phase in the range of high temperatures, A temperature ramp-down from the processing phase to a boat-out temperature, In the case of the invention, the boat-in temperature and boat-out temperature are not equal, contrary to what is practiced in the art.

On the contrary, the boat-in temperature has a "lowered" value which is significantly lower than the boat-out temperature.

This lowered value of boat-in temperature allows avoiding tearing-off defects on the wafers.

This lowered value of boat-in temperature also allows to obtain only a reduced amount of particle contaminants on the wafers treated.

A significant decrease of the particle contaminations can indeed be observed when the boat in/boat out temperature is decreased: the applicant has observed on batches of wafers a reduction in contaminants:

from a median count of 73.3 (boat-in temperature at 600° C.) down to 21.59 (boat-in temperature of 450° C.), in terms of SOD (Sum Of Defects—which accounts for all contamination particle defects), and from a median count of 13.11 (boat-in temperature at 600° C.) down to 8.05 (boat-in temperature of 450° C.), in terms of AC (Area Count—which accounts only for particle defects having a size larger than a threshold value).

At the same time, the boat-out temperature is kept at a value significantly greater than the lowered value of boat-in temperature, in order to avoid degrading the Dit of the wafer.

Avoiding lowering the boat-out temperature down to the same value than the boat-in temperature indeed also avoids degrading the Dit of the wafer treated during the last phase of the HT treatment.

And this specific combination of lowered boat-in temperature with a boat-out temperature kept significantly higher than the boat-in temperature allows obtaining these two advantages (avoiding tearing-off defects on the wafer, and at the same time avoiding degrading the Dit of the wafer).

Generally speaking, the lowered value of boat-in temperature is between 400° C. and 500° C. with a typical value of 450° C., while the value of boat-out temperature is generally between 550° C. and 750° C. with a typical value is 600° C.

Figure 3:
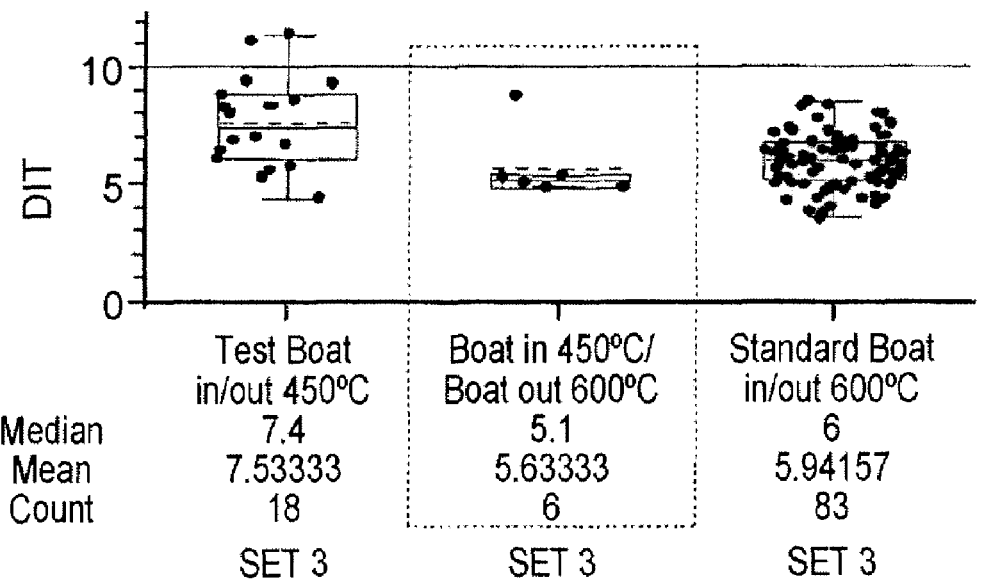
FIG. 3 is a graph illustrating the Dit observed on the SOI wafers of the two sets of batches already commented in reference to FIG. 1, and the Dit observed on a third set of batches ("set 3") of similar SOI wafers, treated according to the invention.

FIG. 3 illustrates the reduction of Dit obtained on a third set of batches of wafers. It is specified that for all sets of wafers presented in the Figures, each point of a graph represents a Dit measurement carried out on one or two wafers of a batch of wafers. The graphs of FIGS. 1 and 3 therefore correspond to a statistics over a very large number of wafers treated.

Figure 1:
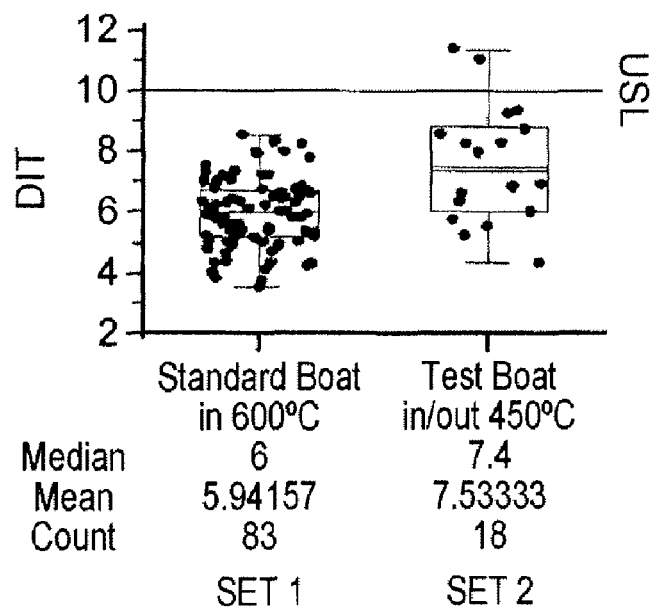
FIG. 1 shows the values of Dit for two respective sets of batches of SOI wafers which have been annealed according to different procedures.

FIG. 3 reproduces the data of sets 1 and 2 already illustrated in FIG. 1. FIG. 3 furthermore comprises data concerning a third set of batches of wafers (set 3). The wafers of this set are similar to the wafers of sets 1 and 2 (they are SOI wafers obtained through the same method). The data for this third set correspond to Dit measurements made on wafers which have undergone a HT treatment according to the temperature evolution of FIG. 2 (boat-in temperature of 450° C., and boat-out temperature of 600° C.). The wafers of set 3 have a Dit which is significantly lower than the Dit of the wafers of sets 1 and 2. Moreover, the measurements made on these wafers of set 3 show that the values of Dit are all (but one measurement) very much concentrated around the same value, and therefore show a very high homogeneity of Dit across the batches of wafers. This corresponds to an additional advantage of the invention.

What is claimed is:

1. A method for annealing a multilayer silicon-on-insulator wafer which comprises subjecting the wafer to a high temperature treatment that includes at least a temperature ramp-up between a boat-in temperature and a process temperature of at least 800° C.; at least a processing phase conducted at or above the process temperature; and a temperature ramp-down from the processing phase to a boat-out temperature, wherein the boat-in temperature is between 50 and 350 degrees Centigrade lower than the boat-out temperature to reduce or avoid tearing-off defects on the wafer and to reduce particle contaminants on the wafer, as well as to reduce or avoid degrading wafer Dit compared to an annealing method where the boat-in and boat-out temperatures are closer in temperature.

2. The method of claim 1, wherein the high temperature treatment comprises an oxidation phase.

3. The method of claim 2, wherein the oxidation phase is carried out at a temperature between 800° C. and 1000° C.

4. The method of claim 3, wherein the oxidation phase is carried out at a temperature of 950° C.

5. The method of claim 2, wherein the high temperature treatment includes a stabilization phase that follows the oxidation phase.

6. The method of claim 5, wherein the stabilization phase is carried out at a temperature between 900° C. and 1200° C.

7. The method of claim 1, wherein the boat-in temperature is below 500° C., the process temperature is between 1125-1200° C., and the boat-out temperature is below 750° C.

8. The method of claim 1, wherein the boat-in temperature is between 400° C. and 500° C.

9. The method of claim 8, wherein the boat-in temperature is 450° C.

10. The method of claim 1, wherein the boat-out temperature is between 550° C. and 750° C.

11. The method of claim 10, wherein the boat-in temperature is 600° C.

12. The method of claim 1, wherein the boat-in temperature is between 100 and 300 degrees Centigrade lower than the boat-out temperature.

13. A method for annealing a multilayer silicon-on-insulator wafer which comprises subjecting the wafer to a high temperature treatment that includes at least a temperature ramp-up between a boat-in temperature of between 400 and 500° C. and a process temperature of at least 800° C.; at least a processing phase conducted at or above the process temperature; a temperature ramp-down from the processing phase to a boat-out temperature, wherein the boat-out temperature is between 550° C. and 750° C. and the boat-in temperature is between 100 and 300 degrees Centigrade lower than the boat-out temperature to reduce or avoid tearing-off defects on the wafer and to reduce particle contaminants on the wafer, as well as to reduce or avoid degrading wafer Dit compared to an annealing method where the boat-in and boat-out temperatures are closer in temperature.

* * * * *